United States Patent
Salo

(10) Patent No.: US 6,748,198 B1
(45) Date of Patent: Jun. 8, 2004

(54) TUNABLE RECEIVER

(75) Inventor: Jarmo Olavi Salo, Guecelard (FR)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 09/454,345

(22) Filed: Dec. 3, 1999

(30) Foreign Application Priority Data

Dec. 8, 1998 (EP) ............................................ 98403089

(51) Int. Cl.$^7$ ................................................. H04B 1/18
(52) U.S. Cl. ................................. 455/150.1; 455/161.1
(58) Field of Search .......................... 455/150.1, 151.3, 455/161.1, 161.3, 179.1, 134, 185, 464, 422, 426, 260, 259, 182, 183.1, 76, 77, 434, 455, 154.1

(56) References Cited

U.S. PATENT DOCUMENTS

| | | | | |
|---|---|---|---|---|
| 4,688,261 A | * | 8/1987 | Killoway et al. | ............... 455/76 |
| 5,027,431 A | * | 6/1991 | Tanaka et al. | ............ 455/161.3 |
| 5,511,235 A | | 4/1996 | Duong et al. | ................. 455/75 |
| 5,574,985 A | * | 11/1996 | Ylikotila | ...................... 455/76 |
| 6,091,963 A | * | 7/2000 | Mannerstrale et al. | ...... 455/550 |
| 6,094,569 A | * | 7/2000 | Wang | ......................... 455/260 |
| 6,212,396 B1 | * | 4/2001 | Brown et al. | ................ 455/464 |
| 6,229,996 B1 | * | 5/2001 | Uistola | .................... 455/168.1 |

FOREIGN PATENT DOCUMENTS

| FR | 2719437 A | | 3/1995 | ............ H04Q/7/22 |
|---|---|---|---|---|
| JP | 401226227 | * | 9/1989 | ................. 455/517 |

* cited by examiner

Primary Examiner—Nay Maung
Assistant Examiner—Tu Nguyen
(74) Attorney, Agent, or Firm—Jack D. Slobod

(57) ABSTRACT

A receiver (REC) is tunable (TUN) to any one of a plurality of channels (CH) by means of channel-select commands (CSC). The receiver tunes to (SRCH) a channel (CH[i]) with a signal (S) having a channel identification (CHIND) that identifies the channel (CH[i]). The receiver defines (DEF) a tuning reference (REF) on the basis of the channel identification (CHIND) and the channel-select command (CSC [j]), which is used for tuning to such a channel (CH[i]). This allows a reduction of cost, because the receiver need not rely on accuracy of tuning components in order to be certain which channel-select command has to be applied for tuning to a particular channel.

11 Claims, 2 Drawing Sheets

TUNABLE RECEIVER

FIELD OF THE INVENTION

The invention relates to a receiver which is tunable to any one of a plurality of channels by means of channel-select commands. The invention may be applied, for example, in a mobile phone that operates in accordance with a standard dividing a frequency band into various channels.

BACKGROUND ART

U.S. Pat. No. 5,551,235 describes a receiver which is part of a cellular telephone transceiver including a transmitter. The receiver comprises a local oscillator which, in a reduction to practice, was varied from 1031 to 1064 MHz in 25 kHz increments to effect scanning of base stations with channels having a 25 kHz bandwidth.

A synthesizer controls the frequency of the local oscillator. The synthesizer includes a reference oscillator. A divide-by-M divider is connected to the output of the reference oscillator and a divide-by-N divider is connected to the output of the local oscillator. The reference frequency is divided down by M, and the local oscillator frequency is divided down by N, both N and M being programmable such that they may be varied. A frequency comparator compares the outputs of the dividers. The result of the comparison is an error signal, which drives a tuning port of the local oscillator. To adjust the local oscillator frequency, the divide-by-N divider is varied until its output frequency is substantially equal to the output frequency of the divide-by-M divider.

The reference oscillator is the reference for the frequency generation system, and is, for example, a 2.5 ppm (parts per million) oscillator. If the reference oscillator is off by 2.5 ppm, then the local oscillator will be off by 2.5 ppm. By reducing the bandwidth of IF filters and/or other filters, the tolerance of the reference oscillator can be significantly loosened to 10 ppm.

SUMMARY OF THE INVENTION

It is an object of the invention to allow a reduction of cost.

The invention takes the following aspects into consideration. A receiver which is tunable to any one of a plurality of channels by means of channel-select commands, should preferably provide the following certainty. It is certain which channel-select command has to be applied for tuning the receiver to a particular channel. If the receiver does not provide this certainty, it will generally be necessary to apply various channel-select commands until the receiver is tuned to a desired channel. This is time-consuming. Moreover, it will be necessary to detect that the receiver is tuned to the desired channel. This may also be time-consuming or, what is worse, may even not be possible for one or more channels.

The prior-art receiver provides the aforementioned certainty. The channel-select commands can be thought of as various values for the N of the divide-by-N divider. The synthesizer, in effect, translates a value for the N of the divide-by-N divider into a local oscillator frequency determining to which channel the receiver is tuned. The local oscillator frequency has an inaccuracy which is substantially equal to that of the reference oscillator. It has been mentioned that the inaccuracy of the reference oscillator is loosened from 2.5 to 10 ppm while, in a reduction to practice, the frequency of a local oscillator was varied from 1031 to 1064 MHz in 25 kHz increments. This is done to effect a scanning of base stations with channels having a 25 kHz bandwidth. A 10 ppm inaccuracy of a 1000 MHz frequency is equal to an inaccuracy of 10 kHz. Consequently, the inaccuracy of the local oscillator frequency is within the bandwidth of the channels. Thus, it is certain which value for the N of the divide-by-N divider has to be applied for tuning the prior-art receiver to a particular channel.

According to the invention, a receiver which is tunable to any one of a plurality of channels by means of channel-select commands, carries out the following steps. The receiver tunes to a channel with a signal having a channel identification that identifies the channel. The receiver defines a tuning reference on the basis of the channel identification and the channel-select command that is used for tuning to such a channel.

The aforementioned steps can provide the certainty which channel-select command has to be applied for tuning the receiver to a particular channel. Consequently, according to the invention, the receiver need not rely on accuracy of tuning components, such as a reference oscillator, for example, to provide this certainty. Thus, the invention allows the use of low-accuracy tuning components, which are generally cheaper than high-accuracy tuning components. Consequently, the invention allows a reduction of cost.

The invention and additional features, which may optionally be used to implement the invention to advantage, are apparent from and elucidated with reference to the drawings described hereinafter by way of non-limitative example.

DESCRIPTION OF PREFERRED EMBODIMENTS

Figure 1:
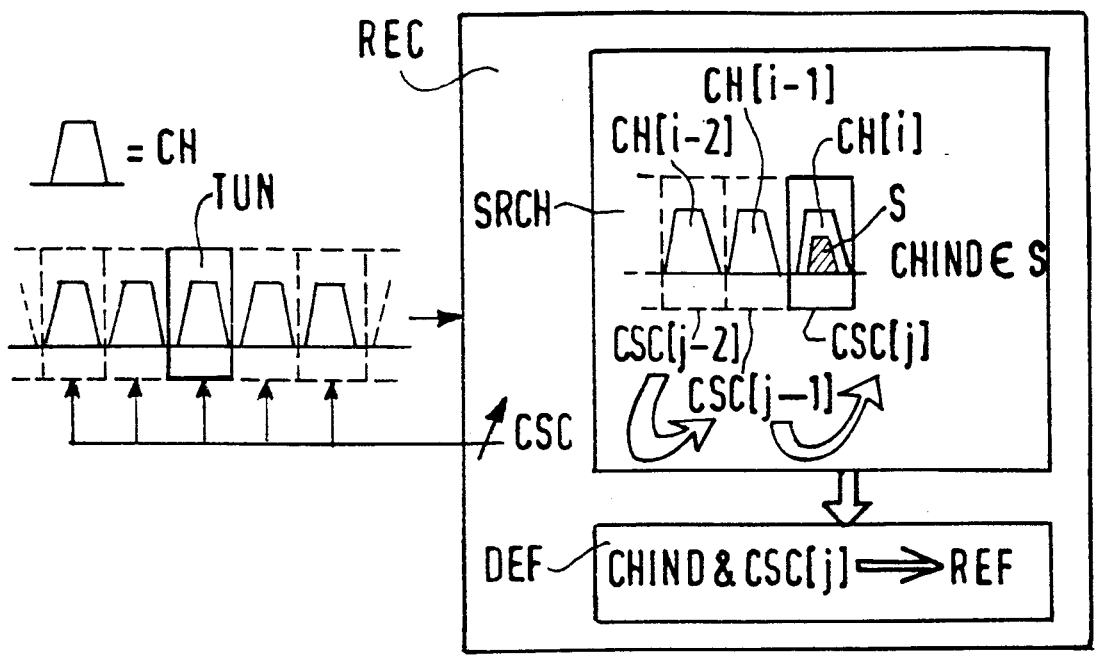
FIG. 1 is a conceptual diagram illustrating basic features of the invention as claimed in claim 1.

First, some remarks will be made on the use of reference characters. Similar entities are denoted by an identical letter code throughout the drawings. Various similar entities may be shown in a single drawing. In that case, a numeral is added to the letter code so as to distinguish similar entities from each other. The numeral will be between parentheses if the number of similar entities is a running parameter. In the description and the claims, any numeral in a reference sign may be omitted where appropriate.

FIG. 1 illustrates basic features of the invention. A receiver REC is tunable TUN to any one of a plurality of channels CH by means of channel-select commands CSC. In a step SRCH, the receiver tunes to a channel CH[i] with a signal S having a channel identification CHIND that identifies the channel. In a step DEF, the receiver defines a tuning reference REF on the basis of the channel identification CHIND and the channel-select command CSC[j] which is used for tuning to such a channel CH[i].

The features illustrated in FIG. 1 may be applied, for example, in a mobile phone operating in accordance with a standard which divides a frequency band into various channels. The mobile-phone standards known as AMPS and NAMPS, define 30 kHz- wide channels in an 800 MHz frequency band. The mobile-phone standards known as TACS and ETACS define 25 kHz-wide channels in a 900 MHz frequency band. Some of these channels are control channels for conveying control messages including overhead messages. An overhead message comprises a local control message which may comprise a binary word identifying the channel number via which the aforementioned messages are conveyed. For example, in AMPS, channel numbers 312 to 355 in a frequency range from 834.36 to 835.65 MHz are dedicated for conveying control messages.

Figure 2:
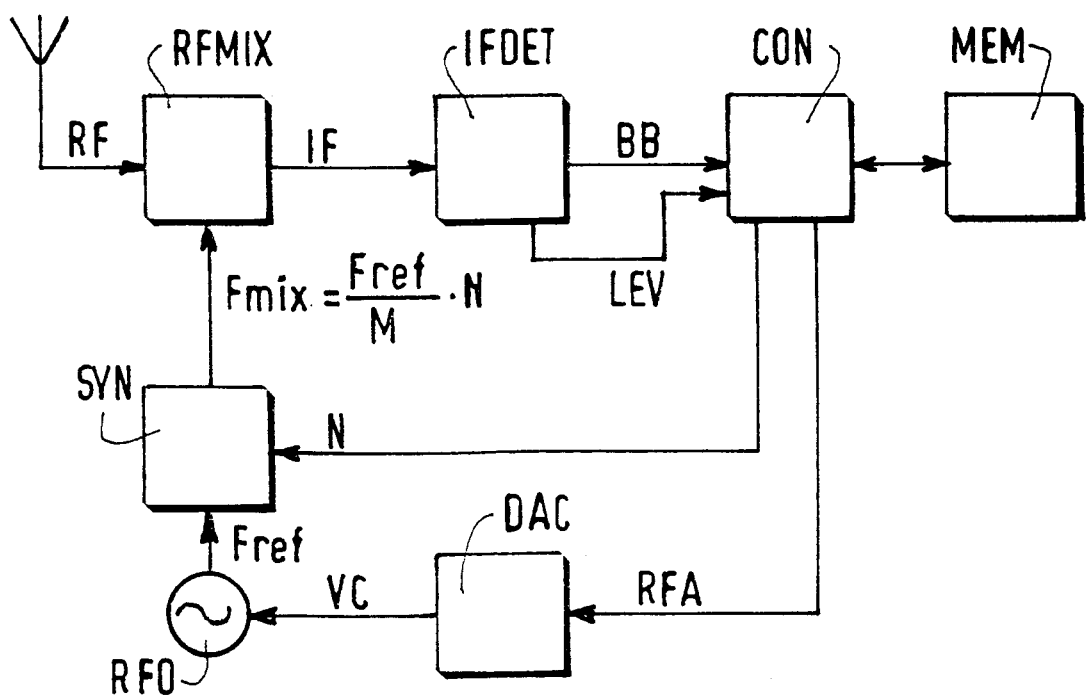
FIG. 2 is a block diagram illustrating an example of a mobile-phone receiver in accordance with the invention.

FIG. 2 illustrates an example of a mobile-phone receiver in accordance with the invention, recapturing the features illustrated in FIG. 1. The mobile-phone receiver is suitable for receiving radio signals RF which originate from a base station operating in accordance with the AMPS, NAMPS, TACS or ETACS standard. The mobile-phone receiver comprises the following main functional blocks: a high-frequency mixer RFMIX, an intermediate-frequency detector IFDET, a controller CON, a memory MEM, a digital-to-analog converter DAC, a reference oscillator RFO, and a synthesizer SYN.

The mobile-phone receiver illustrated in FIG. 2 basically operates as follows. The high-frequency mixer RFMIX converts a radio signal RF, which is located in a particular channel, into an intermediate-frequency signal IF. Any radio signal located in another channel is suppressed. Thus, in effect, the high-frequency mixer RFMIX selects a channel. A mixing frequency Fmix determines which channel is selected.

The intermediate-frequency detector IFDET derives a baseband signal BB from the intermediate-frequency signal IF. It also provides a level indication LEV indicating the strength of the radio-signal RF. The controller CON recognizes and decodes messages contained in the baseband signal BB. The controller CON provides a reference-frequency adjustment value RFA and a channel-select value N, N being an integer. The digital-to-analog converter DAC converts the reference-frequency adjustment value RFA into a control voltage VC. The reference-frequency oscillator RFO provides a reference frequency Fref which varies as a function of the control voltage VC.

The synthesizer SYN provides the mixing frequency Fmix on the basis of the reference frequency Fref and the channel-select value N. The mixing frequency Fmix is N times the reference frequency Fref divided by M, M being an integer. The reference frequency Fref divided by M defines a fixed frequency step which is 30 kHz for AMPS/NAPMS and 25 kHz for TACS/ETACS. Thus, if the channel-select value N increases or decreases by unity, the mixing frequency Fmix will increase or decrease by a channel bandwidth, 30 kHz or 25 kHz. Accordingly, the mobile-phone receiver illustrated in FIG. 2 tunes channel-by-channel, by varying the integer N by unity.

Figure 3:
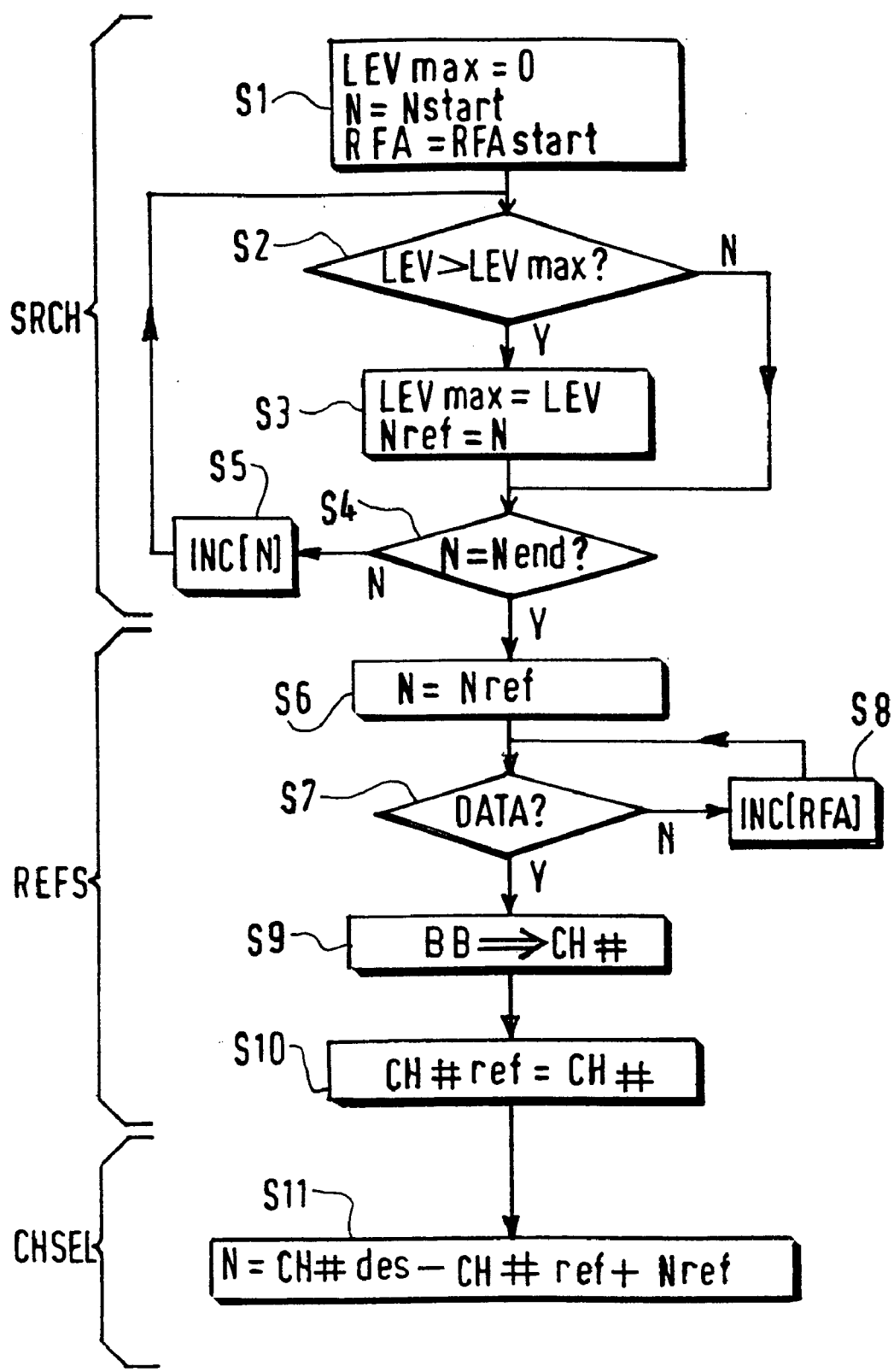
FIG. 3 is a flow-chart diagram illustrating a method in accordance with which the mobile-phone receiver illustrated in FIG. 2 may operate.

FIG. 3 illustrates a method in accordance with which the mobile-phone receiver illustrated in FIG. 2 may operate. The method globally comprises three phases: a control-channel search phase SRCH, a reference-setting phase REFS, and a channel-select phase CHSEL. In the control-channel search phase SRCH, the mobile-phone receiver searches for the control channel that conveys the strongest signal. In the reference-setting phase REFS, the mobile-phone receiver derives a channel number CH# from that signal. In the channel-select phase CHSEL, the mobile-phone receiver uses this channel number, and the channel-select value that was used to tune to the control channel, as a reference for tuning to a desired channel number CH#des.

The control-channel search phase SRCH comprises five steps S1–S5. In step S1, a maximum level LEVmax is given an initial value, which is zero. Furthermore, the channel-select value N and the reference-frequency adjustment RFA values are given start values: N=Nstart and RFA=RFAstart. Accordingly, the mobile-phone receiver will be tuned to a certain channel whose number may not yet be exactly known. The start value Nstart is preferably such that the mobile-phone receiver tunes to the lower boundary of the frequency range in which the control channels are located.

In step S2, the controller CON checks whether the level indication LEV for the channel to which the mobile-phone receiver is tuned, exceeds the maximum level LEVmax. If so, step S3 is carried out. If not, step S3 is by-passed by directly carrying out step S4. In step S3, the controller provides that the maximum level LEVmax equals the level indication LEV. Furthermore, it provides that a reference channel-select value Nref is equal to the channel-select value N that is applied: N=Nref. The controller stores the reference channel-select value Nref in the memory MEM.

In step S4, the controller CON checks whether the channel-select value N equals an end value: N=Nend? The end value Nend is preferably such that the mobile-phone receiver tunes to the upper boundary of the frequency range in which the control channels are located. If the end value Nend has not yet been reached, the channel-select value N is incremented by unity: INC[N] in step S5. Consequently, the mobile-phone receiver will be tuned to the next control channel. Subsequently, steps S2–S4 are carried out for that control channel. If the channel-select value N equals the end value, N=Nend, the mobile-phone receiver goes from the control-channel search phase SRCH to the reference-setting phase REFS.

The reference-setting phase REFS comprises five steps: S6–S10. In step S6, the controller CON provides that the channel-select value N is equal to the reference channel-select value N=Nref. Accordingly, the mobile-phone receiver will be tuned to the control channel that has the strongest signal. In step S7, the controller examines the baseband signal BB, to check whether it contains valid data: DATA? If not, in step S8, the controller CON increments the reference-frequency adjustment value RFA by unity and applies step S7 anew. If the baseband signal BB does contain valid data, step S9 is carried out. In step S9, the control derives a channel number CH# from the baseband signal BB comprising the overhead messages mentioned hereinbefore. In step S10, the controller CON stores the channel number CH# as a reference channel number CH#ref in the memory MEM.

The channel select phase comprises step S11. In step S11, the controller CON calculates a channel-select value N in order to tune to a desired channel that has channel number CH#des. The channel-select value N is the desired channel number CH#des minus the reference-channel number CH#ref plus the reference channel-select value Nref. Thus, the reference-channel number CH#ref and the reference channel-select value Nref, in combination, serve a tuning reference. This tuning reference provides the certainty that the mobile-phone receiver will tune to the desired channel when the channel-select value N is applied.

The drawings and their description hereinbefore illustrate rather than limit the invention. It will be evident that there are numerous alternatives which fall within the scope of the appended claims. In this respect, the following closing remarks are made.

There are numerous ways of physically spreading functions or functional elements over various units. In this respect, the drawings are very diagrammatic, each representing only one possible embodiment of the invention. Thus, although a drawing shows different functional elements as different blocks, this by no means excludes that some functional elements, or all functional elements, may be implemented as a single physical unit. Any reference sign in a claim should not be construed as limiting the claim.

What is claimed is:

1. A receiver that is tunable to a plurality of channels, wherein the receiver:

searches a plurality of control channels for the control channel with a signal having a predetermined criterion;

determines whether the control channel with the signal having the predetermined criterion contains selected information, and if so, deriving a channel identification from the signal;

defines a tuning reference on the basis of the derived channel identification and a channel select value; and tunes to a desired channel based on the tuning reference.

2. The receiver as claimed in claim 1, wherein the predetermined criterion is the strongest signal.

3. The receiver as claimed in claim 1, wherein the channel identification is a channel number.

4. The receiver as claimed in claim 1, wherein the channel select value is used to tune the control channel.

5. The receiver as claimed in claim 4, wherein the receiver assigns an initial value to the channel select value and wherein the receiver increments the channel select value until the receiver is tuned to the upper boundary of the frequency range in which the control channels are located.

6. The receiver as claimed in claim 5, wherein the receiver undertakes the determining of whether the control channel with the signal having the predetermined criterion contains selected information after the channel select value equals a preselected end value.

7. A method of controlling a receiver that is tunable to a plurality of channels wherein the method comprises:

searching a plurality of control channels for the control channel with a signal having a predetermined criterion;

determining whether the control channel with the signal having the predetermined criterion contains selected information, and if so, deriving a channel identification from the signal;

defining a tuning reference on the basis of the derived channel identification and a channel select value; and tuning to a desired channel based on the tuning reference.

8. The method as claimed in claim 7, including the step of using the channel select value to tune to the control channel.

9. The method as claimed in claim 8, including the steps of:

assigning an initial value to the channel select value; and incrementing the channel select value until the receiver is tuned to the upper boundary of the frequency range in which the control channels are located.

10. The method as claimed in claim 9, wherein the determining step takes place after the channel select values equals a preselected end value.

11. A method of operating a mobile phone system comprising a plurality of channels over which signals may be transmitted, wherein the method comprises:

searching a plurality of control channels for the control channel with a signal having a predetermined criterion;

determining whether the control channel with the signal having the predetermined criterion contains selected information, and if so, deriving a channel identification from the signal;

defining a tuning reference on the basis of the derived channel identification and a channel select value; and tuning to a desired channel based on the tuning reference.

* * * * *